United States Patent [19]

Hackleman et al.

[11] Patent Number: 4,695,853
[45] Date of Patent: Sep. 22, 1987

[54] THIN FILM VERTICAL RESISTOR DEVICES FOR A THERMAL INK JET PRINTHEAD AND METHODS OF MANUFACTURE

[75] Inventors: David E. Hackleman, Monmouth, Oreg.; James G. Bearss, Boise, Id.; Eldurkar V. Bhaskar, Corvallis, Oreg.

[73] Assignee: Hewlett-Packard Company, Palo Alto, Calif.

[21] Appl. No.: 941,006

[22] Filed: Dec. 12, 1986

[51] Int. Cl.⁴ .................................................. G01D 15/16
[52] U.S. Cl. .................... 346/140 R; 29/611; 29/846; 219/216; 346/1.1
[58] Field of Search ............ 346/140, 1.1, 76 PH; 219/216; 29/846, 611, 620

[56] References Cited

U.S. PATENT DOCUMENTS

| 4,076,575 | 2/1978 | Chang | 29/846 X |
|---|---|---|---|
| 4,251,824 | 2/1981 | Hara | 346/140 |
| 4,429,321 | 1/1984 | Matsumoto | 346/140 |
| 4,616,408 | 10/1986 | Lloyd | 29/611 |

Primary Examiner—Joseph W. Hartary
Attorney, Agent, or Firm—William J. Bethurum

[57] ABSTRACT

The specification describes thermal ink jet (TIJ) processes and device structures produced thereby wherein either heater resistors or heater resistor-diode combinations are constructed vertically upward from a common supporting substrate. A lower or first metal level conductor pattern provides one part of an X-Y matrix multiplex connection to the resistor/diode components, and a second, upper metal level conductor pattern forms the second part of the X-Y matrix multiplex connection. In this manner, the multiplex drive circuitry for the TIJ printhead resistors/diodes may be fabricated (integrated) directly on the thin film resistor (TFR) printhead substrate. Additionally, the second level metal conductors which overlie the resistive heater and diode elements also serve as a barrier shield to ink corrosion and cavitation wear.

9 Claims, 35 Drawing Figures

| | |
|---|---|
| TIMING SCHEDULE #1 | RD$_1$ FIRES AT t=2 |
| | RD$_2$ FIRES AT t=3 |
| | RD$_3$ FIRES AT t=4 |

| | |
|---|---|
| TIMING SCHEDULE #2 | RD$_1$ FIRES AT t=2 |
| | RD$_2$ FIRES AT t=3 |
| | RD$_3$ & RD$_4$ FIRE AT t=4 |

*Fig. 5C*

THIN FILM VERTICAL RESISTOR DEVICES FOR A THERMAL INK JET PRINTHEAD AND METHODS OF MANUFACTURE

TECHNICAL FIELD

The present invention relates generally to thermal ink jet (TIJ) printing and more particularly to new and improved thermal ink jet printhead device structures employing vertical resistors and a metal ink barrier having improved resistance to ink corrosion and cavitation wear.

BACKGROUND ART

In the field of thermal ink jet printing, it has become a common practice to provide heater resistors on a common substrate and align these heater resistors with individual ink reservoirs and corresponding ink ejection orifices in an outer nozzle plate. These heater resistors are physically defined and electrically driven by conductive traces which are photolithographically formed on the surface of a suitable resistor layer material, such as tantalum-aluminum. These heater resistors have been traditionally isolated from the overlying ink reservoirs by highly inert dielectric materials such as silicon carbide and silicon nitride. This type of thermal ink jet printhead is described, for example, in the *Hewlett Packard Journal,* Vol. 36, No. 5, May 1985, incorporated herein by reference.

Thus, the current flowing in this type of printhead flows laterally in the conductive trace material and then down and again laterally through the resistive tantalum aluminum layer where no trace material appears and then back up and again laterally through the conductive trace material.

DISCLOSURE OF INVENTION

In significant contrast to the above lateral resistor and inert dielectric barrier construction of the prior art, the present invention provides new and improved printhead construction featuring the use of vertical heater resistors in combination with a metal, rather than a dielectric, barrier layer. These vertical heater resistors provide conductive paths from electrically conductive leads on an underlying substrate and through openings in an insulating pattern and then to either a single conductive bus member or to an upper set of leads for the resistors. The upper conductor also serves as the ink barrier layer between the vertical heater resistors and the ink reservoirs. When used as bus bar, this metal barrier layer may be grounded and thus made nonreactive to the ink which it shields against, and thus offers an improved resistance to ink corrosion and cavitation wear during an ink jet printing operation.

In an alternative embodiment of our invention, the vertical resistors may be appropriately doped to form PN junctions (diodes) in the resistive material and may then be selectively connected to certain ones of the electrical leads on both the underside and the topside of these PN junctions so as to form an X-Y matrix type of diode multiplexing circuit which may be integrated on the surface of a single printhead substrate member.

Thus, the present invention not only improves the barrier-to-corrosion/cavitation wear, but it simultaneously provides a novel vertical resistor/diode integrated driving multiplex circuit which may be fabricated on the surface of a single substrate.

The above advantages and novel features of this invention will become more readily apparent in the following description of the accompanying drawing.

BEST MODE FOR CARRYING OUT THE INVENTION

Referring now to FIG. 1, the legend for the insulating substrate (S), the first level metal layer or conductor number 1 ($C_1$), the insulating layer (I), the resistive layer (R), and the second level conductor or conductor number 2 ($C_2$) apply to all of the four process embodiments described herein as will be indicated in more detail below. Additionally, a table of values for materials, layer thicknesses, resistivities and other significant electrical properties is given below for the various layers formed in the different embodiments of the invention. Accordingly, these various device properties will not be further recited throughout the specification.

Figure 1A:
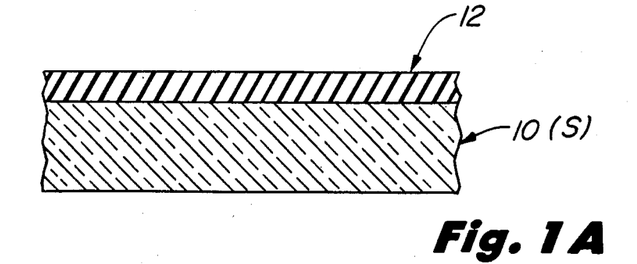
FIGS. 1A-1H are schematic cross section views of a first process used to fabricate one type of printhead device structure and multiplex circuit according to the present invention.
Figure 1B:
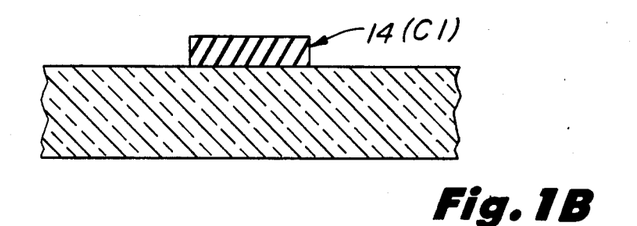

In a first embodiment of the invention, an insulating substrate 10 is adapted to recieve a first level metal layer 12 which is sputtered or evaporated on the surface of the substrate 10 using conventional metal deposition techniques. Then, as indicated in FIG. 1B, the metal layer 12 is patterned to form a first level metal conductor 14.

Figure 1C:
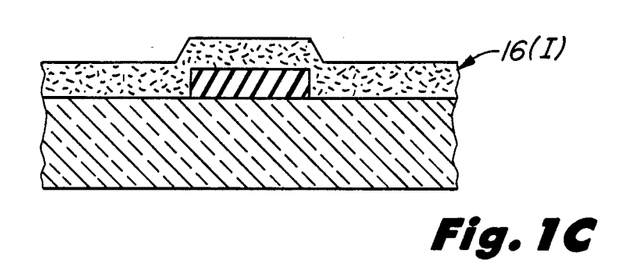
Figure 1D:
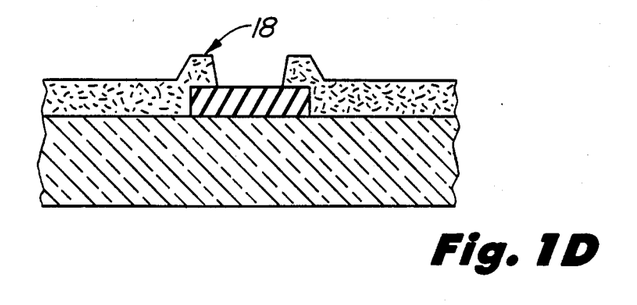
Figure 1E:
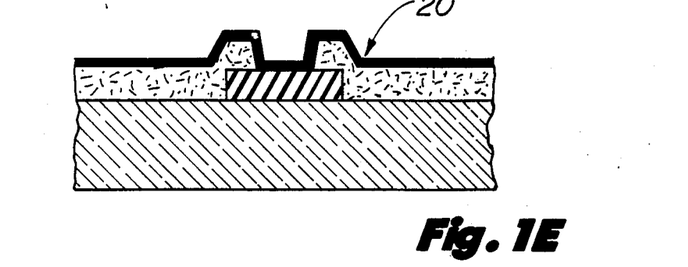
Figure 1F:
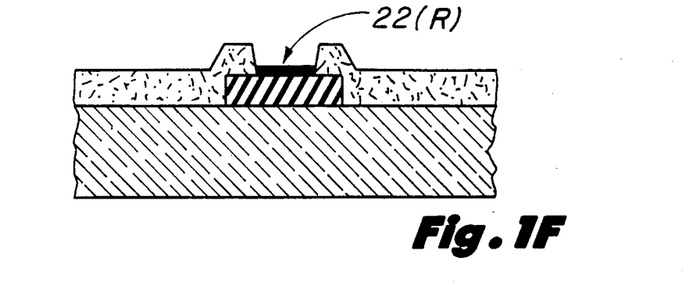

Next, an insulating layer 16 is provided as shown in FIG. 1C and then patterned as indicated in FIG. 1D to provide an opening 18 therein. Then, a resistive layer 20 is deposited on the surface of FIG. 1D to form the structure of FIG. 1E which is subsequently masked and etched to leave the vertical resistor pad 22 as shown in FIG. 1F. When the resistor pad 22 is to be formed as a combination resistor/diode component for use in diode matrix multiplex circuits, then the resistive layer formation step of FIG. 1E must include appropriate PN junction processing such solid state diffusion, ion-implantation, or metal-semiconductor rectifying junction forming processes known in the art. One suitable process for forming a PN junction in the resistor pad 22 would be to first form the pad 22 of polycrystalline silicon using, for example, low-pressure chemical vapor deposition, LPCVD. Then, phosphorous ions can be implanted into the polysilicon pad 22 in a concentration between $10^{19}$ and $10^{21}$ ions per cubic centimeter and then annealed in a nitrogen atmosphere from between 3-4 hours.

Alternatively, this PN junction could be replaced by a Shottky barrier junction which is created by first forming a P-type polysilicon resistor pad and then depositing a gold conductor on this resistor pad to establish a Shottky barrier junction at the polysilicon-gold interface, as is well known in the art.

Figure 1G:
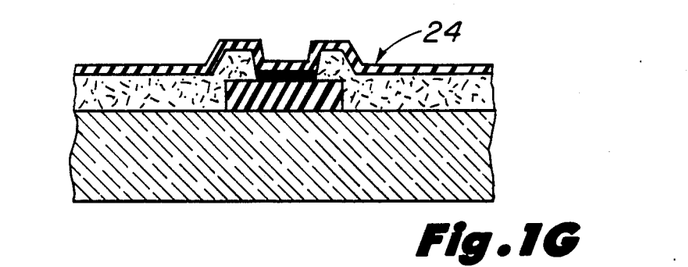
Figure 1H:
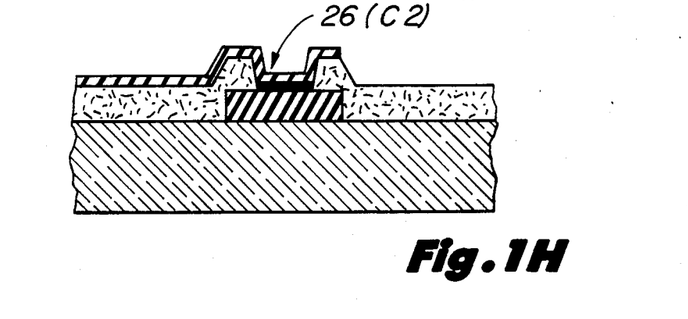

Next, as shown in FIG. 1G, a top surface layer or second level metal layer 24 is deposited on the surface of the structure whereafter the conductive pattern 24 is further defined such as by selective etching to leave the second level metal conductor 26 with the geometry shown in FIG. 1H.

Figure 1I:
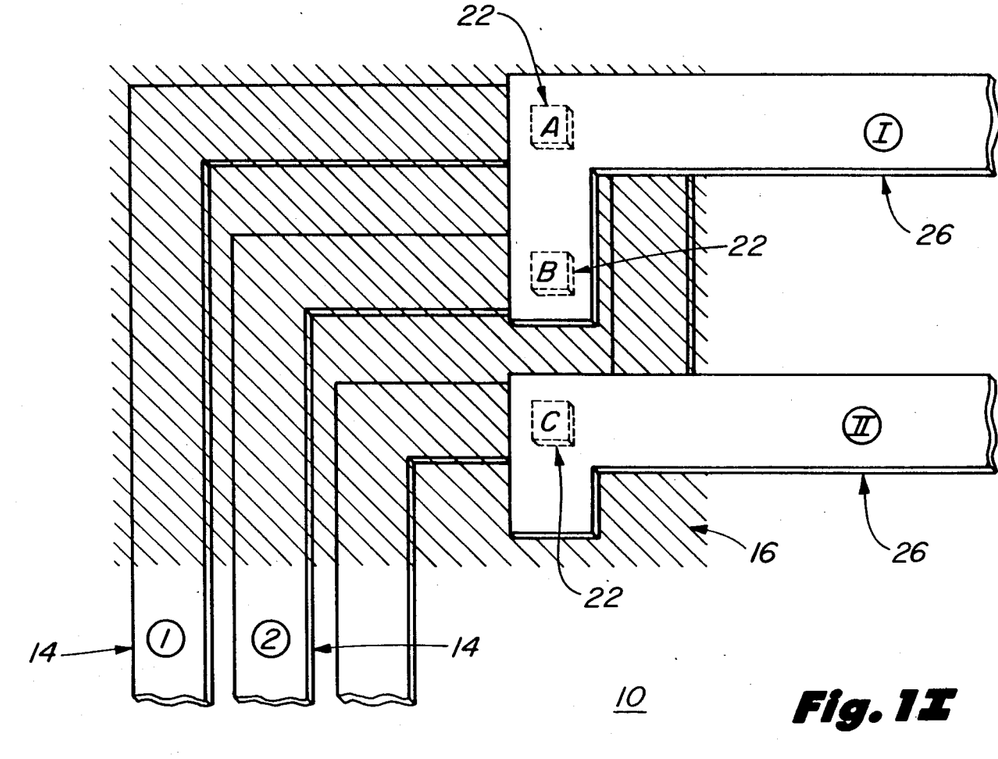
FIG. 1I is a plan view of the resistor/diode multiplex circuit fabricated by the process of FIGS. 1A-1H.

Using photolithographic exposure, masking and etching techniques known to those skilled in the art, one may topographically define the multiplex circuit shown in FIG. 1I. In this figure, the substrate 10, the first level metal conductor 14, the insulating layer 16, the heater resistor 22 and the second level metal conductor 26 are designated with reference numerals corresponding to like reference numeral indicating the same materials in previous FIGS. 1A-1H.

Figure 2A:
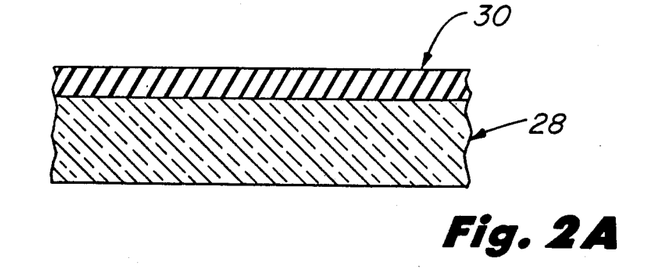
FIGS. 2A-2G are schematic cross section views illustrating a second process embodiment of the invention.
Figure 2B:
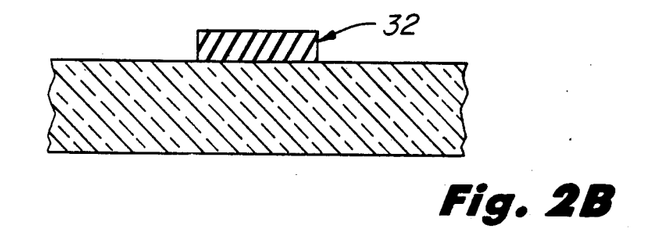
Figure 2C:
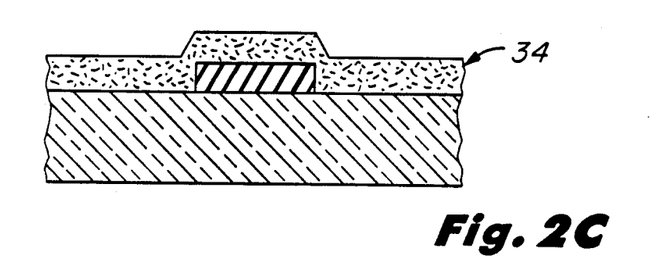
Figure 2D:
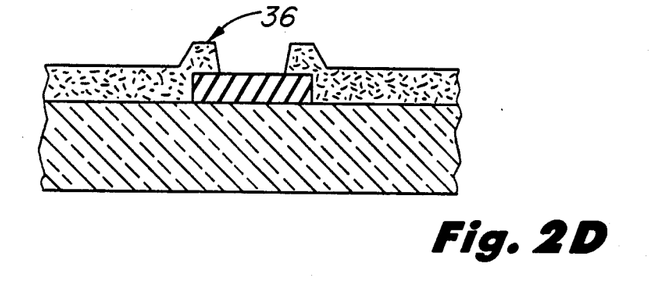
Figure 2E:
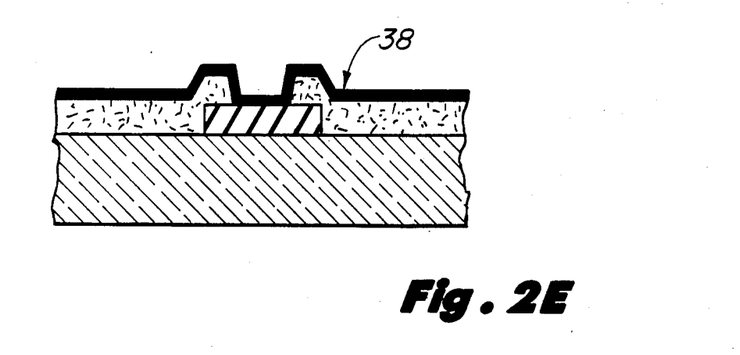
Figure 2F:
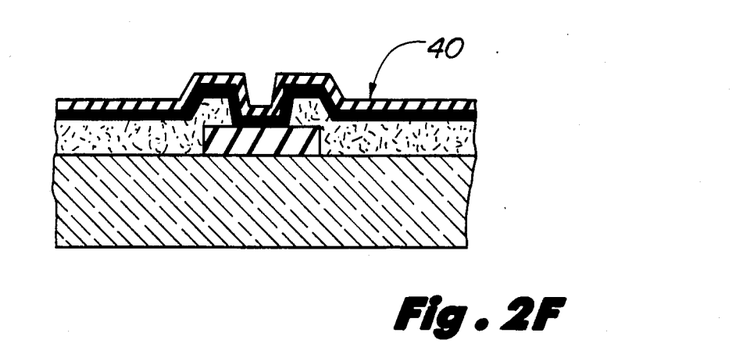
Figure 2G:
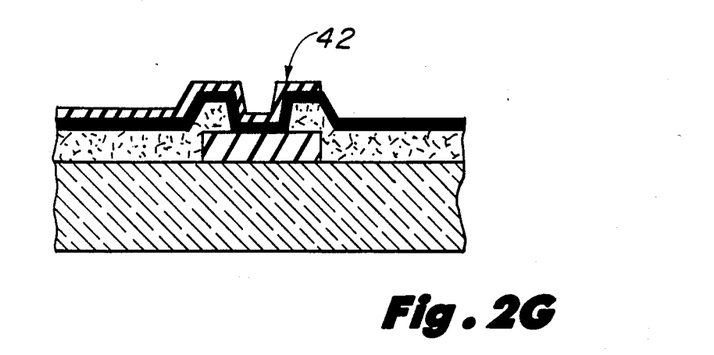

The following TABLE is applicable to all of the fabrication sequences described herein:

metal conductor pattern is defined as shown in FIG. 2G.

Figure 2H:
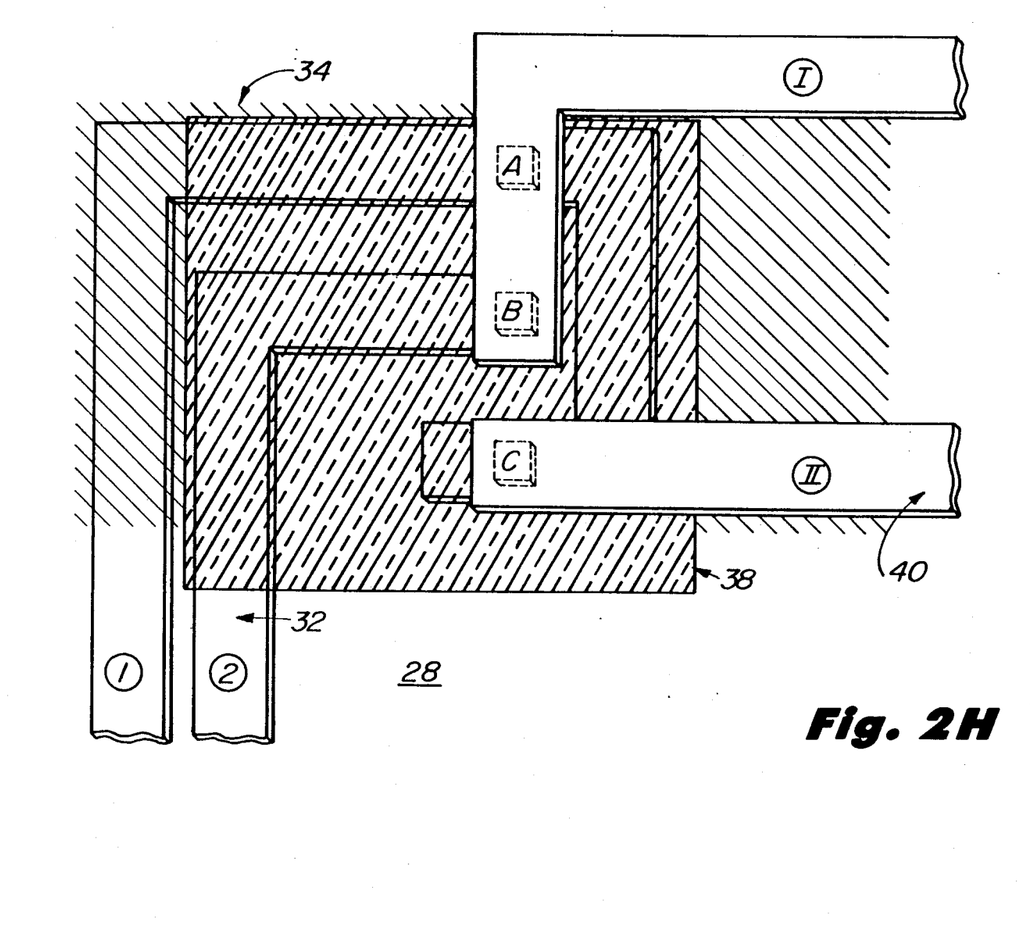
FIG. 2H is a plan view illustrating the multiplex circuit connection for a plurality of resistors or diodes formed in accordance with FIGS. 2A-2G.

Referring now to FIG. 2H, the multiplex circuit connection shown therein is the same for both the above process of FIGS. 2A-2G and the process of FIGS. 4A-4G to be described below. In FIG. 2H, multiplex signals applied to leads 1 and I will fire the resistor/diode A, whereas multiplex signals applied to leads 1 and II will fire resistor/diode C. Signals applied simultaneously to leads 2 and I will fire the resistor/diode B.

Figure 3A:
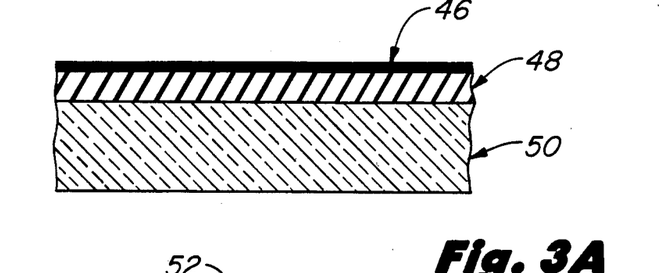
FIGS. 3A-3G illustrate in schematic cross section a third process embodiment of the invention.
Figure 3B:
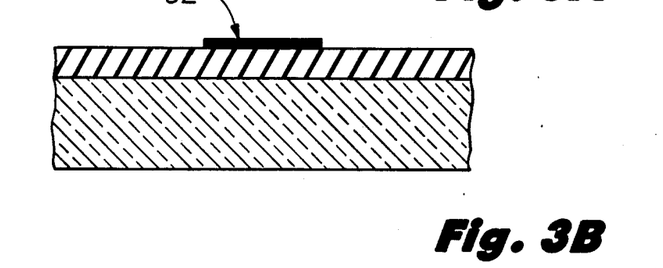
Figure 3C:
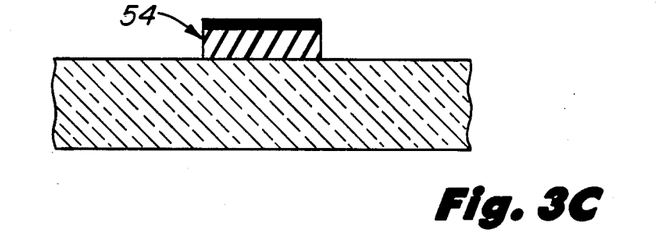

Referring now to FIG. 3A, in this process embodiment a resistive cover layer 46 is applied as shown to the upper surface of a first level metal layer 48 which in turn was previously formed on the upper surface of an insulating substrate 50. Then, using conventional masking and etching processes, a resistive island 52 is developed as shown in FIG. 3B to define the heater resistor. Then, as shown in FIG. 3C, the resistive island 52 is used as an etch mask to form the first level metal conductor 54.

Figure 3D:
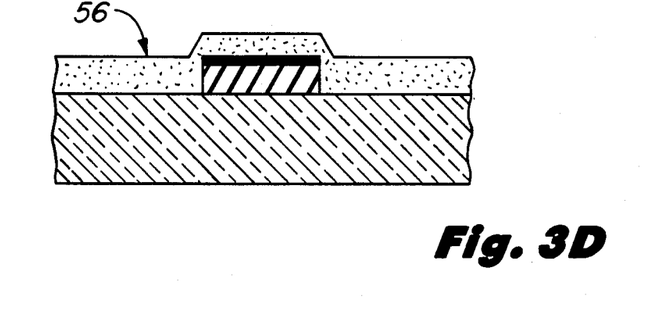
Figure 3E:
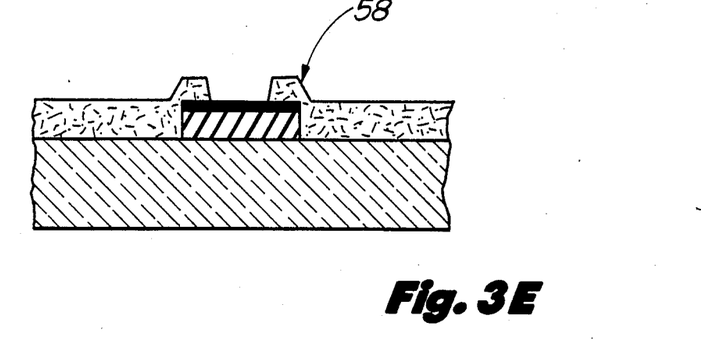

Next, an intermediate insulating layer 56 is deposited as shown in FIG. 3D, and then this layer 56 is masked and etched to form the opening 58 therein as shown in FIG. 3E. Then, an upper, second level metal layer 60 is formed atop the entire surface of the structure as shown

TABLE

| LAYER | SUITABLE MATERIAL | DEPOSITION PROCESS | THICKNESS (MICRONS) | RESISTIVITY ohm · cm |
|---|---|---|---|---|
| Insulating Substrate (S) | Oxidized Silicon<br>Glazed Ceramic Glass<br>Silicon Oxynitride | Thermal Oxidation | | |
| First Level Conductor (C1) | Aluminum<br>Aluminum-Copper Alloy<br>Aluminum-Silicon Alloy<br>Gold | Sputtering | 0.5 to 2.0 | 2 to 3 |
| Insulating Layer (I) | Silicon Dioxide<br>Silicon Nitride<br>Silicon Oxynitride | PECVD*<br>LPCVD* | 1.0 to 2.0 | |
| Resistor/Diode Layer (R) | Polysilicon<br>Carbon<br>Silicon Carbide<br>Indium Tin Oxide<br>Zinc Oxide<br>Cadmium Sulphide | PECVD/LPCVD<br>PECVD<br>PECVD/Sputter<br>Sputter<br>Sputter<br>Evaporation/Sputter | 1.0 to 2.0 | 0.5 to 3.0 |
| Second Level Conductor (C2) | Tantalum Gold<br>Gold<br>Tantalum Silicide | Sputter | 1.0 | 2 to 3 |

PECVD* = Plasma Enhanced Chemical Vapor Deposition
LPCVD* = Low Pressure Chemical Vapor Deposition In FIG. 1I, there is shown a multiplex connection of lower electrical leads 1 and 2 used in combination upper electrical leads I and II and connected to fire the resistor/diodes indicated as A, B and C. Thus, a multiplexed combination of leads 1 and I fires resistor/diode A and a multiplexed combination of leads 1 and II fires resistor/diode C. Alternatively, a multiplexed combination of leads 2 and I will fire resistor/diode B.

Referring now to FIGS. 2A-2G, an insulating substrate 28 is disposed to receive a first level metal layer 30 of FIG. 2A which is then patterned as shown in FIG. 2B to provide a first level metal conductor 32. Then, an intermediate insulating layer 34 is deposited as shown in FIG. 2C and defined as shown in FIG. 2D to leave an opening 36 therein and identical thus far to the process of FIG. 1. However, at this point the resistive layer 38 is deposited over the entire top surface of the structure as shown in FIG. 2E and is there left intact.

Figure 3F:
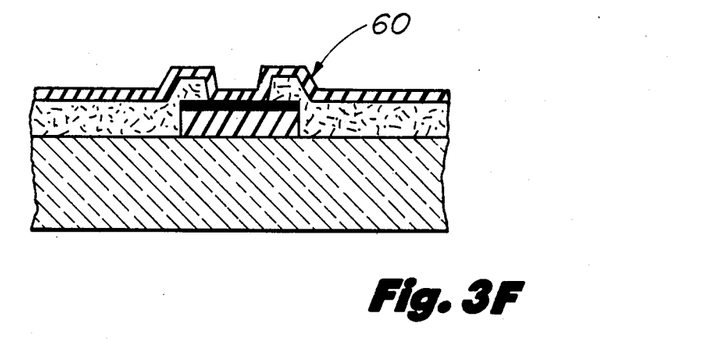
Figure 3G:
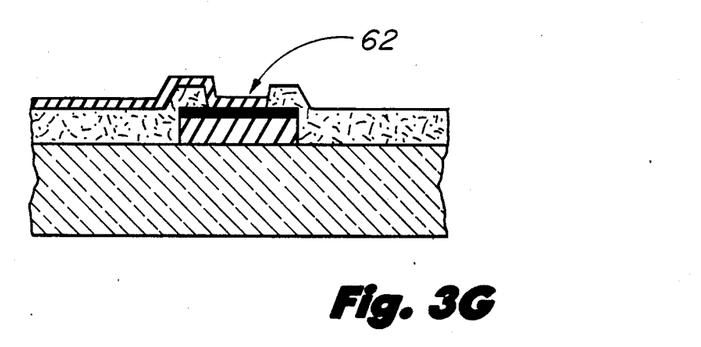

Next, an upper, second level metal layer 40 is deposited over the entire surface of the resistive layer 38 as indicated in FIG. 2F, and thereafter the second level in FIG. 3F and thereafter defined using photolithographic metal etch processes known in the art to form the upper or second level metal conductor pattern 62 as shown in FIG. 3G.

Figure 3H:
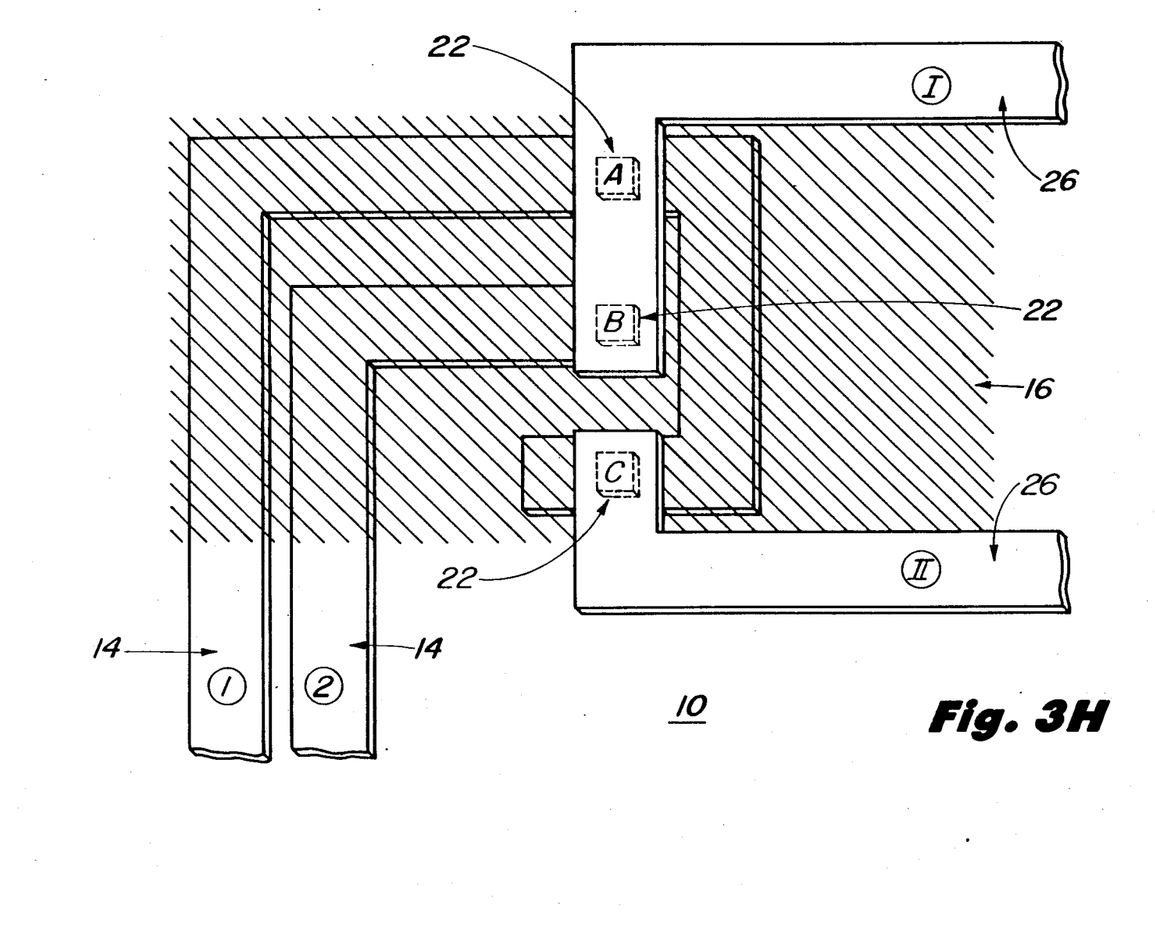
FIG. 3H is a plan view illustrating the multiplex circuit connection for structures fabricated using the process sequence of FIGS. 3A-3G.

Referring now to FIG. 3H, the firing schedule for the multiplex circuit shown in this figure is identical to the firing schedule of the multiplex circuits shown in FIGS. 1I and 2H previously described.

Referring now to FIG. 4, there is shown a forth process embodiment according to the invention. In this embodiment the substrate 64 and first level metal layer 66 of FIG. 4A are masked and etched to define a first level metal conductor 68 as shown in FIG. 4B. Then, a resistive layer 70 is deposited over the entire surface of the structure of FIG. 4B to thereby provide the layered structure as shown in FIG. 4C.

Figure 4A:
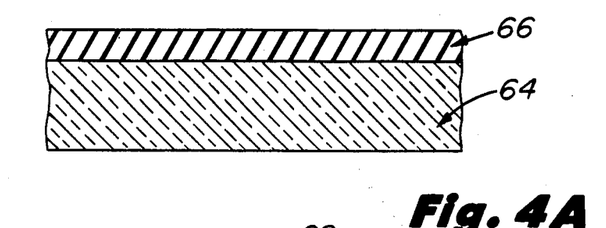
FIGS. 4A-4G illustrate in schematic cross section a fourth process embodiment according to the invention.
Figure 4B:
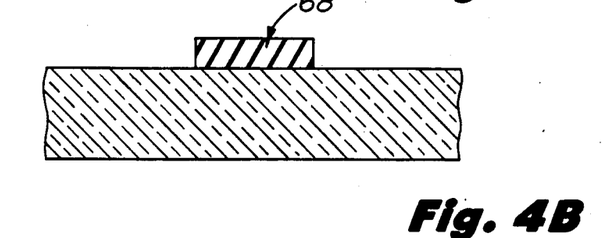
Figure 4C:
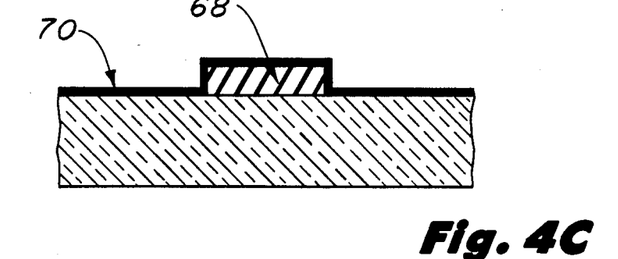
Figure 4D:
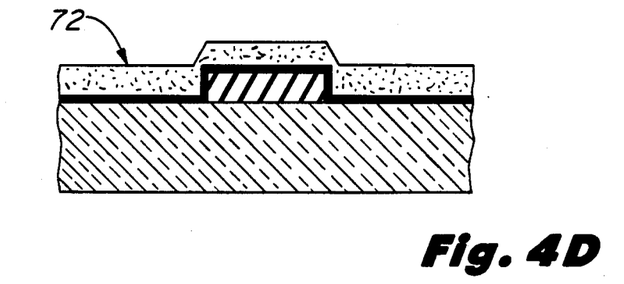
Figure 4E:
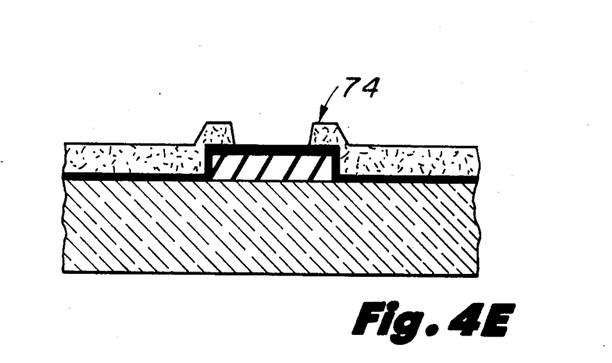
Figure 4F:
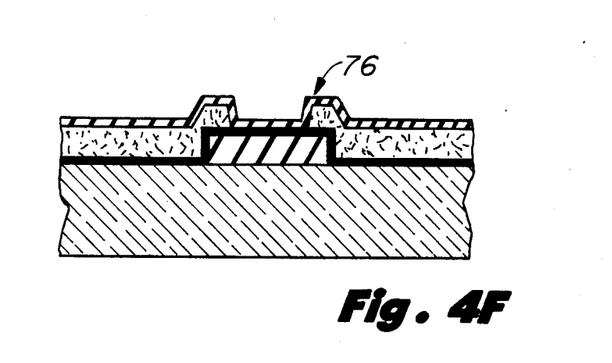
Figure 4G:
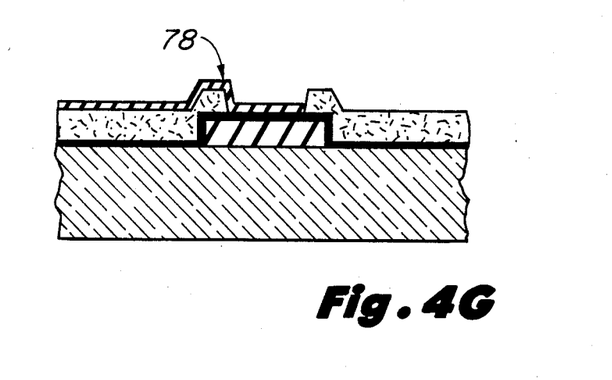

Next, the structure of FIG. 4C is provided with an intermediate insulating layer 72 as shown in FIG. 4D which is then masked and etched to provide an opening 74 therein as shown in FIG. 4E. Then, an upper second level conductive layer 76 is deposited across the entire surface of the structure as shown in FIG. 4F, and finally this conductive layer 76 is photolithographically defined as a second metal level or upper conductor 78 on the top surface of FIG. 4G.

As previously mentioned, the multiplex circuit of FIG. 2H is applicable to the present process of FIG. 4, and device structure produced thereby and is not described in further detail herein.

Figures 5A, 5B:
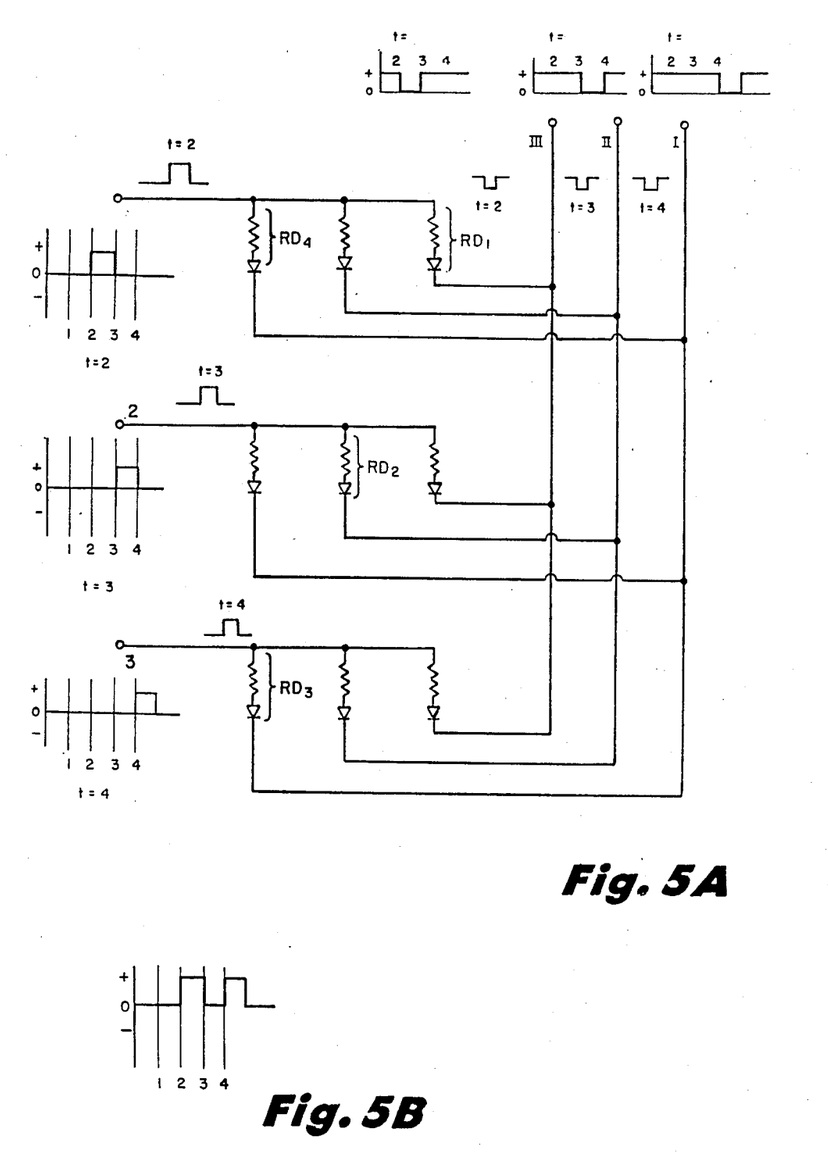
FIG. 5 is a schematic diagram for a nine (9) diode and nine (9) resistor XY matrix type multiplex circuit which may be constructed using the vertical resistor/diode construction techniques of the invention.

Referring now to FIG. 5, there is shown in FIG. 5A a nine resistor-diode (RD) multiplex circuit which illustrates how the previously described 3-diode (A,B,C) networks of FIGS. 1-4 can be expanded into a larger X-Y multiplex matrix. In this matrix of FIG. 5A, there is no specific relation between the resistor-diode combinations shown therein and the A, B and C diodes of FIGS. 1-4 which are primarily intended to show a general plan view layout for the adjacent resistor-diodes.

Figure 5C:
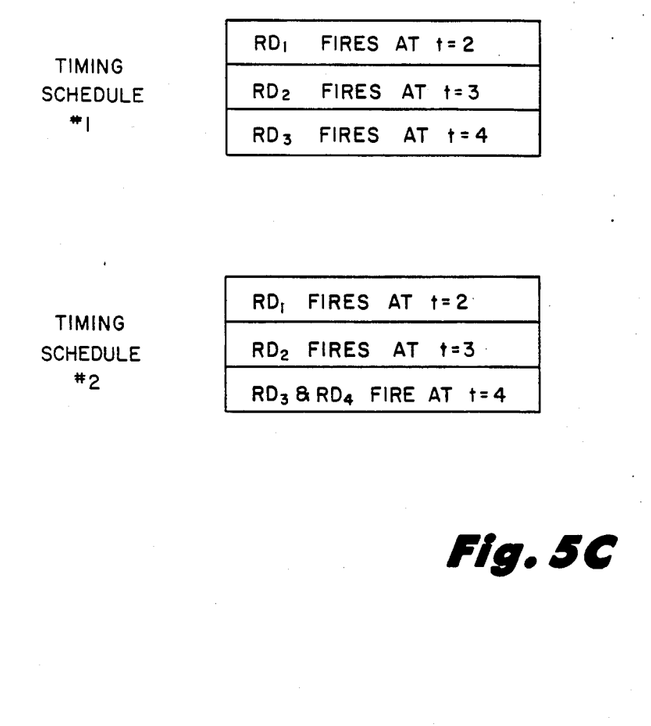

In FIG. 5A, each resistor-diode (RD) combination fires when a positive-going pulse is applied to the anode of the diode and simultaneously a negative-going pulse is applied to the cathode of the diode. Hence, the timing schedule no. 1 in FIG. 5C represents the firing of resistor-diodes $RD_1$, $RD_2$ and $RD_3$ at times $t=2$, $t=3$ and $t=4$ for the six pulse waveforms applied to the X-Y matrix terminals 1, 2 and 3 and I, II and III, respectively. However, when the pulse waveform in FIG. 5B is applied to terminal no. 1 in FIG. 5A, both resistor-diodes $RD_3$ and $RD_4$ will fire at time $t=4$.

Thus, it will be appreciated by those skilled in the art that using the proper selection of pulse waveforms at the X-Y matrix input terminals, any resistor-diode combination in FIG. 5A can be fired. This feature greatly enhances the packing density and integration of resistors, diodes and conductive trace patterns on the ink ejection surface area of a printhead substrate.

INDUSTRIAL APPLICABILITY

This invention is useful in the production of thermal ink jet printheads and printhead integrated circuits which in turn are used in disposable ink jet heads in TIJ printers.

We claim:

1. A thin film resistor device suitable for use in a thermal ink jet printhead comprising:
    a. a substrate member,
    b. a conductive patten disposed atop an upper surface of said substrate member,
    c. an insulating layer disposed on said conductive pattern and having openings therein aligned with preselected areas on said conductive pattern,
    d. a resistive layer of a selected resistivity formed on said preselected areas on said conductive pattern, and
    e. a metal barrier layer disposed atop said resistive layer and thereby providing an electrical path for current flowing through said resistive layer and also a shield against ink corrosion and cavitation wear.

2. The structure defined in claim 1 wherein said resistive layer is doped with impurities to form a PN junction, whereby said device may be used as a diode multiplex circuit.

3. In a thermal ink jet heater device wherein an insulating pattern is formed on a substrate, the improvement comprising a heater resistor disposed in an opening in said insulating pattern, and conductive leads disposed on the top and bottom surfaces of said heater resistor to provide current vertically through said heater resistor during an ink jet printing operation.

4. The device defined in claim 3 wherein said heater resistor is treated to form a rectifying junction diode therein, whereby said device may be used in a diode multiplex circuit for driving an ink jet printhead.

5. A process for manufacturing a thermal ink jet thin film resistor device which includes the steps of:
    a. forming a conductive lead pattern on one surface of a selected substrate,
    b. forming an insulating pattern having openings therein aligned with certain areas on said conductive lead pattern.
    c. forming a resistive layer in contact with said conductive lead pattern, and
    d. depositing a top metal barrier layer on the surface of said resistive layer which may then be used as an electrical connection for said resistive layer as well as an ink barrier layer between ink reservoirs and said resistive layer to shield against ink corrosion and cavitation wear.

6. The process defined in claim 5 which includes the intermediate step of forming a PN or other rectifying junction in said resistive layer whereby said device may be used as a diode matrix multiplex circuit.

7. An integrated X-Y matrix diode multiplex circuit and resistive heater printhead structure which includes:
    (a) an X conductive pattern formed on the surface of a printhead substrate,
    (b) a resistive heater element disposed on said X conductive pattern and including a rectifying junction therein, and
    (c) a Y conductive pattern connected to the top surface of said resistive heater element and insulated from said X conductive pattern by an insulating layer, whereby said X and Y conductive patterns may be fabricated integrally on said printhead structure and there connected to receive diode multiplex signals and provide diode multiplexing of said signals directly on said printhead structure, and said Y conductive pattern may also serve as a metal barrier shield against ink corrosion and cavitation wear during thermal ink jet printing.

8. A process for fabricating a vertical resistor printhead structure which includes;
    a. forming a conductive pattern on the surface of an insulating or semiconducting substrate,
    b. forming an insulating mask on said conductive pattern,
    c. forming a resistive layer atop the surface of said insulating mask and atop a selected area of said conductive pattern,
    d. forming a conductive layer atop said resistive layer, and
    e. defining said conductive layer to form another conductive pattern and thereby provide an XY interconnect matrix by said first and second conductive patterns to said resistive layer.

9. The process defined in claim 8 which further includes treating selected areas of said resistive layer to form a rectifying junction diode therein, whereby said matrix is operable as a diode multiplex circuit and capable of integration on the surface of said printhead structure.

* * * * *